(12) United States Patent
Ito

(10) Patent No.: US 8,902,405 B2
(45) Date of Patent: Dec. 2, 2014

(54) STAGE APPARATUS, EXPOSURE APPARATUS AND DEVICE FABRICATION METHOD

(75) Inventor: Atsushi Ito, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 278 days.

(21) Appl. No.: 13/311,767

(22) Filed: Dec. 6, 2011

(65) Prior Publication Data

US 2012/0147352 A1      Jun. 14, 2012

(30) Foreign Application Priority Data

Dec. 14, 2010   (JP) ................................. 2010-278394

(51) Int. Cl.
*G03B 27/42* (2006.01)
*G03F 7/20* (2006.01)
*G01B 9/02* (2006.01)

(52) U.S. Cl.
CPC .............. *G01B 9/02* (2013.01); *G03F 7/70783* (2013.01); *G03F 7/70775* (2013.01)
USPC .................................. 355/53; 355/72; 355/77

(58) Field of Classification Search
CPC . G03F 7/70775; G03F 7/70725; G03F 7/707; G03F 7/7085; G03F 7/70783; G03F 7/709; G03F 7/70708; G03F 9/7088; G03F 9/7096
USPC ............................ 355/30, 53, 72, 77; 356/509
See application file for complete search history.

(56) References Cited

U.S. PATENT DOCUMENTS

| 6,741,328 B2 | 5/2004 | Yonekawa et al. |
| 7,499,180 B2 | 3/2009 | Hattori |
| 8,681,314 B2 | 3/2014 | Ebihara et al. |
| 2002/0044269 A1 * | 4/2002 | Yonekawa et al. .............. 355/53 |

FOREIGN PATENT DOCUMENTS

| JP | 11008189 A | 1/1999 |
| JP | 2003203842 A | 7/2003 |
| JP | 2005317600 A | 11/2005 |
| WO | 2007049603 A1 | 5/2007 |

OTHER PUBLICATIONS

Machine translation of JP 2005317600 A (NPL).*
Office Action dated Aug. 29, 2014, issued in Japanese Patent Application No. 2010-278394.

* cited by examiner

*Primary Examiner* — Mesfin T Asfaw
(74) *Attorney, Agent, or Firm* — Rossi, Kimms & McDowell LLP

(57) ABSTRACT

The present invention provides a stage apparatus including a first Y-axis interferometer which is supported by a base portion, and configured to detect a position of a first end surface of a table in a Y-axis direction, a second Y-axis interferometer which is supported by the base portion, and configured to detect a position of a second end surface of the table in the Y-axis direction, and a third Y-axis interferometer which is supported by the base portion so as to be spaced apart from the first Y-axis interferometer and the second Y-axis interferometer in an X-axis direction, and configured to detect a distance according to which a distance between the first Y-axis interferometer and the second Y-axis interferometer in the Y-axis direction can be obtained.

6 Claims, 6 Drawing Sheets

STAGE APPARATUS, EXPOSURE APPARATUS AND DEVICE FABRICATION METHOD

BACKGROUND OF THE INVENTION

1. Field of the Invention

The present invention relates to a stage apparatus, an exposure apparatus, and a device fabrication method.

2. Description of the Related Art

An exposure apparatus is employed in a photolithography process for fabricating, for example, a semiconductor device. The exposure apparatus includes a projection exposure apparatus which projects and transfers the pattern of a reticle (mask) onto a wafer (substrate) by a projection optical system, and an electron beam exposure apparatus which directly draws a pattern on a wafer without using a reticle.

With miniaturization of semiconductor devices, such an exposure apparatus must improve the overlay accuracy of a pattern to be transferred onto the wafer to form a multilayered structure, and is therefore required to attain a pattern transfer position accuracy on the order of several nanometers or less. Hence, the exposure apparatus executes, before an exposure process, an alignment process, that is, global alignment as an example. In the global alignment, alignment marks formed in several representative shot regions on the wafer are measured, and the measurement results are statistically processed, thereby obtaining the exposure target position of each shot region on the wafer.

On the other hand, in the exposure apparatus, due, for example, to vibration, an external force, or a change in temperature, deformation is often generated in a table which holds the wafer or a base portion which supports an interferometer for measuring the position of the table. Thermal deformation is generated in the table or wafer when heat produced by a driving unit which drives the table, for example, is transmitted to the table, or a change in temperature is generated in the wafer due to exposure heat (for example, the energy of an electron beam). Also, the base portion vibrates when vibration generated upon driving the table, or disturbance vibration of the floor on which a stage apparatus is installed, is transmitted to it. The vibration of the base portion includes rigid vibration and elastic vibration that mainly constitute the entire vibration of the base portion, and three-dimensional bending deformation is generated in the base portion due to the elastic vibration. Thermal deformation is generated in the base portion as well when heat produced by the driving unit which drives the table, for example, is transmitted to it. If deformation is generated in the base portion during the alignment process, the position of the interferometer for measuring the position of the table fluctuates, so an error is generated in the measurement value obtained by the interferometer, and an error, in turn, is generated in the obtained exposure target position. In contrast, if deformation is generated in the table or base portion after the alignment process, a transfer error such as a shift in position or a shift in magnification (a shift in size) is generated in the transferred pattern even when the wafer (the table which holds it) is positioned at the exposure target position obtained by the global alignment.

Several techniques of correcting the exposure target position to compensate for the deformation of the table or base portion have conventionally been proposed. Japanese Patent Laid-Open No. 2005-317600 discloses a technique of arranging two interferometers on opposite sides of the table, and obtaining the deformation amount of the table from the measurement values (that is, the positions of the two end surfaces of the table in one direction) obtained by the two interferometers, thereby correcting the exposure target position based on the obtained deformation amount. Also, Japanese Patent Laid-Open No. 11-008189 discloses a technique of obtaining, in advance, a correction equation expressing the relationship between the measurement error generated by the interferometer and the value (the deformation amount of the base portion) output from a strain gauge disposed on the base portion which supports the interferometer, thereby correcting the exposure target position using the correction equation and the value output from the strain gauge in the exposure process.

Unfortunately, in the technique disclosed in Japanese Patent Laid-Open No. 2005-317600, if deformation (for example, thermal deformation) is generated in the base portion which supports the two interferometers, the deformation amount of the base portion is included in that of the table, which is obtained from the measurement values obtained by the two interferometers, thus making it impossible to correct the exposure target position with high accuracy. This is because the measurement value obtained by each of the two interferometers contains three components: the position of the table, the deformation amount of the table, and the deformation amount of the base portion (that is, a fluctuation in distance between the two interferometers).

Assuming, for example, that the linear expansion coefficient of the base portion is $12\times10^{-6}$ [1/° C.], the distance between the two interferometers is 1 [m], and a change in temperature of 0.001 [° C.] is generated in the base portion, the distance between the two interferometers considerably fluctuates by 12 [nm]. At this time, the deformation amount of the table, which is obtained from the measurement values obtained by the two interferometers, includes an error of 12 [nm] corresponding to the deformation amount of the base portion, thus making it difficult to correct the exposure target position on the order of several nanometers or less. Note that the distance between the two interferometers is assumed to be 1 [m] because this numerical value is appropriate for (the stage apparatus of) an exposure apparatus which exposes a wafer having a diameter of 300 [mm]. More specifically, the length of each side of the table which holds the wafer is about 500 to 600 [mm], and the range in which the table can move is about ±200 to ±250 [mm], so the two interferometers must have a distance of about 1 [m] between them. Also, the base portion has a relatively high volume and, in turn, a relatively high heat capacity, so a change in temperature is less likely to be generated in the base portion, but nonetheless only a minute change in temperature of about 0.001 [° C.] is generated in the base portion due to factors associated with the surrounding environment or temperature regulation accuracy.

On the other hand, in the technique disclosed in Japanese Patent Laid-Open No. 11-008189, the value output from the strain gauge and the measurement error generated by the interferometer (that is, the fluctuation in position of the interferometer) do not always have a unique correspondence. This is because two types of deformation, expansion/contraction deformation mainly due to thermal deformation, and three-dimensional bending deformation mainly due to vibration (in the Z-axis direction), are generated in the base portion.

FIG. 8A is a view showing a fluctuation in position of the interferometer when expansion/contraction deformation is generated in the base portion, and FIG. 8B is a view showing a fluctuation in position of the interferometer when bending deformation is generated in the base portion. Note that referring to FIGS. 8A and 8B, dotted lines indicate the state before deformation is generated in the base portion, and solid lines indicate the state after deformation is generated in the base portion. As can be seen from FIGS. 8A and 8B, even when a strain gauge is disposed, for example, near the interferometer on the base portion, the coefficient for converting the value output from the strain gauge into a fluctuation in position of the interferometer changes depending on whether expansion/contraction deformation or bending deformation is generated. Therefore, the technique disclosed in Japanese Patent Laid-Open No. 11-008189 often cannot correct the exposure target position with high accuracy.

Supposedly, it is possible to arrange a plurality of strain gauges on the base portion to divide the entire deformation of the base portion into expansion/contraction deformation and bending deformation from the values output from the plurality of strain gauges. However, in this case, there arise problems that, for example, the apparatus arrangement becomes more complex upon arranging a plurality of strain gauges, and a correction equation must be obtained for each type of deformation (expansion/contraction deformation and bending deformation) generated in the base portion (that is, it takes much time to correct the exposure target position). Furthermore, to obtain correction equations, expansion/contraction deformation and bending deformation must independently be generated in the base portion, but this is difficult in practice, thus making it hard to precisely obtain a correction equation for each type of deformation. When, for example, a correction equation for expansion/contraction deformation is to be obtained, it is difficult to completely cut off vibration that generates bending deformation in the base portion. Similarly, when a correction equation for bending deformation is to be obtained, it is difficult to completely eliminate thermal deformation (a change in temperature) that generates expansion/contraction deformation in the base portion. Therefore, even when the exposure target position is corrected using correction equations obtained in advance, it includes an error to a certain extent. Also, processing of dividing the entire deformation of the base portion into expansion/contraction deformation and bending deformation from the values output from the plurality of strain gauges, and processing of selecting an appropriate correction equation, for example, are necessary in the alignment process, and this may lower the apparatus throughput.

SUMMARY OF THE INVENTION

The present invention provides a technique advantageous in positioning a table.

According to one aspect of the present invention, there is provided a stage apparatus comprising: a base portion; a table capable of moving along an X-Y plane defined in an X-Y-Z coordinate system; a first Y-axis interferometer which is supported by the base portion so as to have a first measurement optical path in a Y-axis direction of the X-Y-Z coordinate system, and configured to detect measurement light which passes through the first measurement optical path, is reflected by a first end surface of the table, and travels back along the first measurement optical path, thereby measuring a position of the first end surface in the Y-axis direction; a second Y-axis interferometer which is supported by the base portion so as to have a second measurement optical path in the Y-axis direction, and configured to detect measurement light which passes through the second measurement optical path, is reflected by a second end surface of the table, that is opposite to the first end surface in the Y-axis direction, and travels back along the second measurement optical path, thereby measuring a position of the second end surface in the Y-axis direction; a third Y-axis interferometer which is supported by the base portion so as to have a third measurement optical path in the Y-axis direction and be spaced apart from the first Y-axis interferometer and the second Y-axis interferometer in an X-axis direction of the X-Y-Z coordinate system, and configured to detect measurement light returned from a round trip along the third measurement optical path, thereby measuring a distance according to which a distance between the first Y-axis interferometer and the second Y-axis interferometer in the Y-axis direction can be obtained; and a control unit configured to obtain a deformation amount of the table based on the measurement value obtained by the first Y-axis interferometer, the measurement value obtained by the second Y-axis interferometer, and the measurement value obtained by the third Y-axis interferometer, and obtain a corrected target position by correcting a target position of the table based on the deformation amount of the table, thereby positioning the table so that a position of the table, which is obtained from the measurement value obtained by the first Y-axis interferometer, and the measurement value obtained by the second Y-axis interferometer, is set at the corrected target position.

Further features of the present invention will become apparent from the following description of exemplary embodiments with reference to the attached drawings.

DESCRIPTION OF THE EMBODIMENTS

Figure 1:
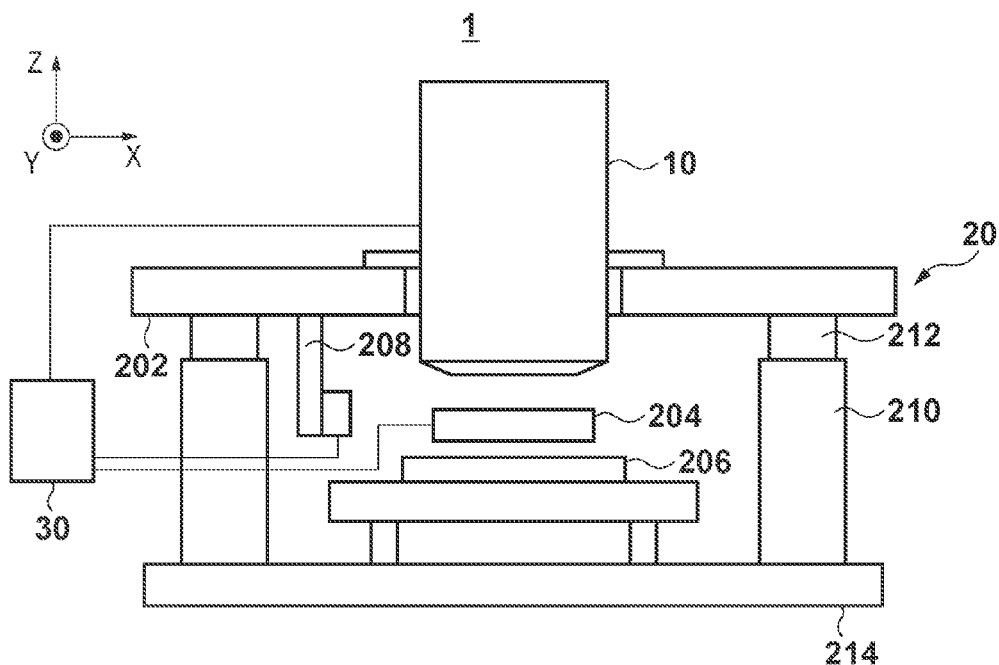
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

Figure 2:
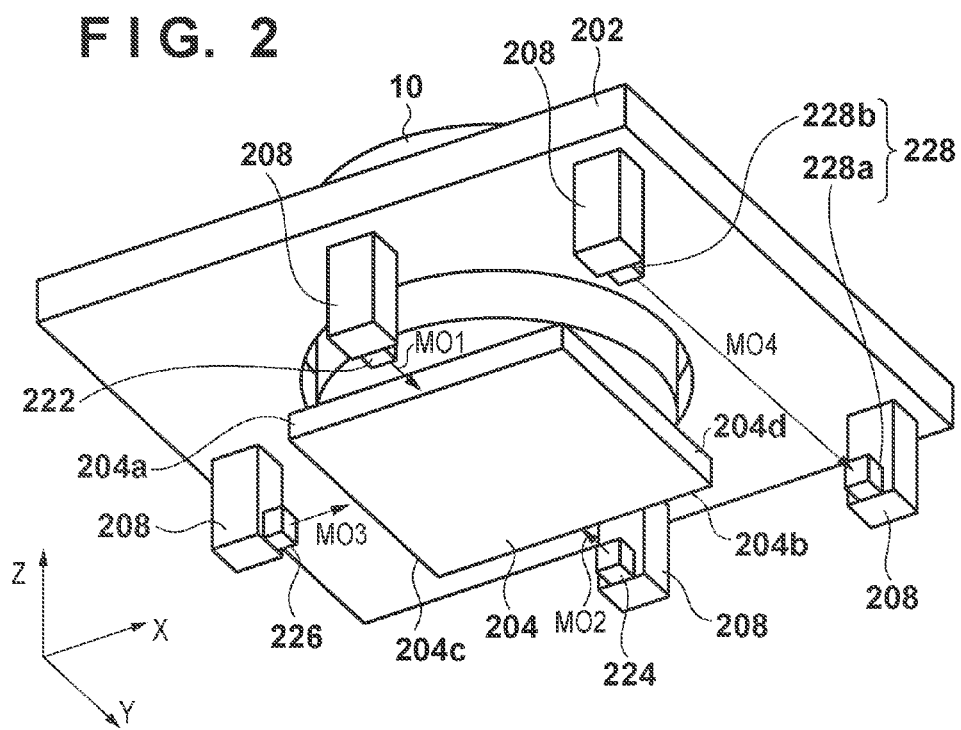
FIG. 2 is a schematic perspective view showing the arrangement of a stage apparatus of the exposure apparatus, shown in FIG. 1, as viewed from the positive Z-axis direction.

FIG. 1 is a schematic view showing the arrangement of an exposure apparatus 1 according to an aspect of the present invention. FIG. 2 is a schematic perspective view showing the arrangement of a stage apparatus 20 of the exposure apparatus 1 as viewed from the positive Z-axis direction. The exposure apparatus 1 is an electron beam exposure apparatus which forms (draws) a pattern on a substrate (for example, a wafer) using an electron beam (charged-particle beam).

The exposure apparatus 1 includes an electron optical system (column) 10 which projects an electron beam onto a substrate (that is, exposes the substrate), the stage apparatus 20 which holds and drives the substrate, and a control unit 30. The control unit 30 includes, for example, a CPU and memory, and controls the overall exposure apparatus 1 (its operation). The control unit 30, for example, obtains the target position of a table by global alignment in an alignment process before an exposure process to position the table at the obtained target position. At this time, the control unit 30 obtains the deformation amount of the table to obtain a corrected target position by correcting the target position of the table based on the obtained deformation amount of the table, thereby positioning the table so that the position of the table is set at the corrected target position, as will be described later.

The stage apparatus 20 includes a base portion 202, a table 204 capable of moving along an X-Y plane defined in an X-Y-Z coordinate system, and a driving unit 206 which drives the table 204, as shown in FIG. 1. The base portion 202 supports the electron optical system 10 in the vicinity of its center, and also supports, via columns 208, interferometers (a first Y-axis interferometer 222, second Y-axis interferometer 224, first X-axis interferometer 226, and third Y-axis interferometer 228) for measuring the position of the table 204. Also, the base portion 202 is supported by a foundation 214 via base legs 210 and antivibration devices 212. The table 204 has a large range within the X-Y plane, in which it can move, so that the entire surface of the substrate can be exposed. The driving unit 206 is configured to be able to drive the table 204, which holds the substrate, at six degrees of freedom: three translational axes and three rotational axes.

The stage apparatus 20 also includes the first Y-axis interferometer 222, second Y-axis interferometer 224, first X-axis interferometer 226, and third Y-axis interferometer 228, as shown in FIG. 2. The first Y-axis interferometer 222, second Y-axis interferometer 224, first X-axis interferometer 226, and third Y-axis interferometer 228 are supported by the base portion 202 via the different columns 208 to fall outside the range in which the table 204 can move. The table 204 has a first end surface 204a, second end surface 204b, and third end surface 204c which serve as reflecting surfaces formed by, for example, aluminum vapor deposition. Therefore, measurement light beams from the first Y-axis interferometer 222, second Y-axis interferometer 224, and first X-axis interferometer 226 are reflected by the first end surface 204a, second end surface 204b, and third end surface 204c, respectively, of the table 204.

The first Y-axis interferometer 222 includes a light source which emits measurement light in the positive Y-axis direction, and a detection unit which detects the measurement light, and is supported by the base portion 202 so as to have a measurement optical path (first measurement optical path) MO1 in the Y-axis direction. The first Y-axis interferometer 222 detects measurement light which passes through the measurement optical path MO1, is reflected by the first end surface 204a of the table 204, and travels back along the measurement optical path MO1, thereby measuring the position of the first end surface 204a in the Y-axis direction.

The second Y-axis interferometer 224 includes a light source which emits measurement light in the negative Y-axis direction, and a detection unit which detects the measurement light, and is supported by the base portion 202 so as to have a measurement optical path (second measurement optical path) MO2 in the Y-axis direction. The second Y-axis interferometer 224 detects measurement light which passes through the measurement optical path MO2, is reflected by the second end surface 204b of the table 204, and travels back along the measurement optical path MO2, thereby measuring the position of the second end surface 204b in the Y-axis direction. Note that the second end surface 204b is opposite to the first end surface 204a.

The first X-axis interferometer 226 includes a light source which emits measurement light in the positive X-axis direction, and a detection unit which detects the measurement light, and is supported by the base portion 202 so as to have a measurement optical path MO3 in the X-axis direction. The first X-axis interferometer 226 detects measurement light which passes through the measurement optical path MO3, is reflected by the third end surface 204c of the table 204, and travels back along the measurement optical path MO3, thereby measuring the position of the third end surface 204c in the X-axis direction.

The third Y-axis interferometer 228 includes a light source which emits measurement light in the positive Y-axis direction, a Y-axis reflecting mirror 228a which reflects the measurement light, and a detection unit 228b which detects the measurement light reflected by the Y-axis reflecting mirror 228a. The third Y-axis interferometer 228 is supported by the base portion 202 so as to have a measurement optical path MO4 in the Y-axis direction and be spaced apart from the first Y-axis interferometer 222 and second Y-axis interferometer 224 in the X-axis direction. The third Y-axis interferometer 228 detects the measurement light returned from a round trip along the measurement optical path MO4, thereby measuring a distance according to which the distance between the first Y-axis interferometer 222 and the second Y-axis interferometer 224 in the Y-axis direction can be obtained.

In this embodiment, the Y-axis reflecting mirror 228a is supported by the base portion 202 so that its Y- and Z-axis coordinates are the same as those of the second Y-axis interferometer 224, and only its X-axis coordinate is different from that of the second Y-axis interferometer 224. Also, the detection unit 228b is supported by the base portion 202 so that its Y- and Z-axis coordinates are the same as those of the first Y-axis interferometer 222, and only its X-axis coordinate is different from that of the first Y-axis interferometer 222. Therefore, the third Y-axis interferometer 228 measures the distance between the Y-axis reflecting mirror 228a and the detection unit 228b, that is, a distance corresponding to the distance between the first Y-axis interferometer 222 and the second Y-axis interferometer 224 in the Y-axis direction in this embodiment. The Y-axis reflecting mirror 228a and detection unit 228b are arranged such that the measurement optical path MO4 does not interfere with the range in which the table 204 can move.

With such an arrangement, even if two types of deformation, expansion/contraction deformation and bending deformation are generated in the base portion 202, the measurement value obtained by the third Y-axis interferometer 228 becomes nearly equivalent to the distance (its fluctuation) between the first Y-axis interferometer 222 and the second Y-axis interferometer 224 in the Y-axis direction.

Assume, for example, that bending deformation is generated in the base portion 202 in FIG. 2. In this case, a fluctuation in distance between the first Y-axis interferometer 222 and the second Y-axis interferometer 224, and that in distance between the Y-axis reflecting mirror 228a and the detection unit 228b are nearly equivalent to each other. This is because the first Y-axis interferometer 222 and detection unit 228b are placed at the same Z-axis coordinate so that the bending angle and the bending span (the length of the columns 208) about the X-axis become equal at the position of the first Y-axis interferometer 222 and that of the detection unit 228b. Note that the same holds true for the relationship between the second Y-axis interferometer 224 and the Y-axis reflecting mirror 228a. As for bending components about the Y-axis, the first Y-axis interferometer 222, the second Y-axis interferometer 224, and the third Y-axis interferometer 228 (Y-axis reflecting mirror 228a and detection unit 228b) fluctuate in the X-axis direction, but do not fluctuate in the Y-axis direction, so these bending components have no influence on the measurement values obtained by these interferometers.

On the other hand, assume that expansion/contraction deformation is generated in the base portion 202. In this case, a fluctuation in distance between the first Y-axis interferometer 222 and the second Y-axis interferometer 224, and that in distance between the Y-axis reflecting mirror 228a and the detection unit 228b are nearly equivalent to each other. This is because the first Y-axis interferometer 222 and detection unit 228b are placed at the same Y-axis coordinate. Note that the same holds true for the relationship between the second Y-axis interferometer 224 and the Y-axis reflecting mirror 228a.

To be precise, placing the interferometers at the same coordinate means setting the measurement light beams emitted by the interferometers at the same coordinate position (exit coordinate). However, in practice, the interferometers cannot perfectly be placed at the same coordinate, and need only be positioned to be able to measure the position of the table with a desired accuracy. Assume, for example, that the interferometers are disposed with an error of 1 [mm] with respect to the design Y-axis coordinate, the linear expansion coefficient of the base portion is $12 \times 10^{-6}$ [$1/°$ C.], the distance between the two interferometers is 1 [m], and a change in temperature of 0.001 [° C.] is generated in the base portion. In this case, the measurement error generated by the interferometers due to deformation of the base portion is on the order of 0.01 [nm]. This measurement error falls well within the tolerance as long as the target exposure position is to be corrected on the order of several nanometers, so the interferometers need only be positioned on the order of about 1 [mm].

Positioning of the table 204 by the control unit 30 will be described below with reference to FIGS. 3A and 3B. In this case, let $Y_1$, $Y_2$, and $Y_3$ be the measurement value obtained by the first Y-axis interferometer 222, that obtained by the second Y-axis interferometer 224, and that obtained by the third Y-axis interferometer 228, respectively, and $X_1$ be the measurement value obtained by the first X-axis interferometer 226.

Figure 3A:
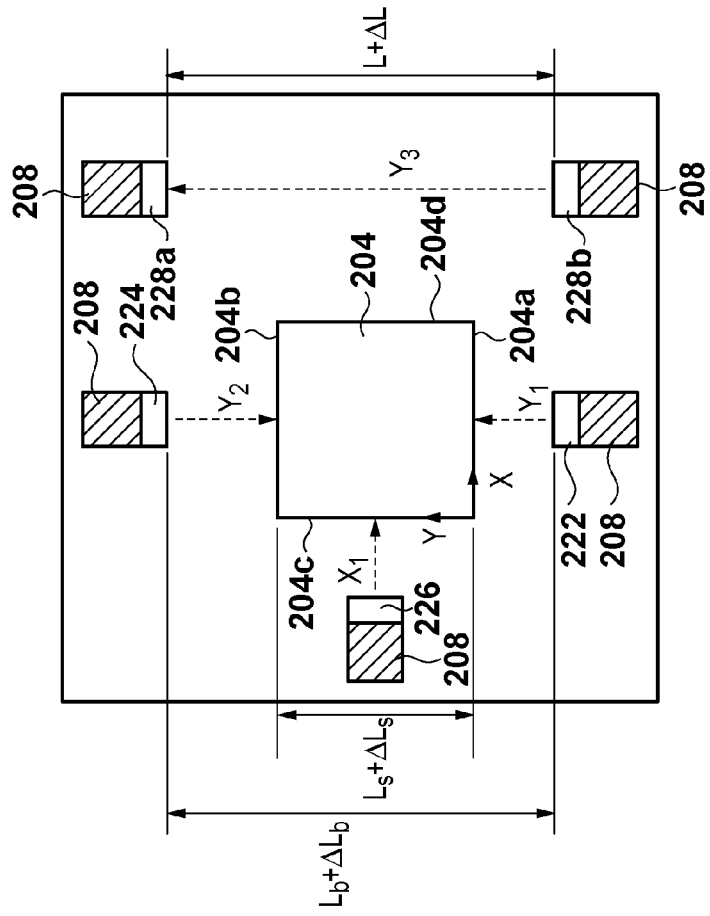
FIGS. 3A and 3B are schematic plan views showing the stage apparatus, shown in FIG. 2, as viewed from the negative Z-axis direction.
Figure 3B:
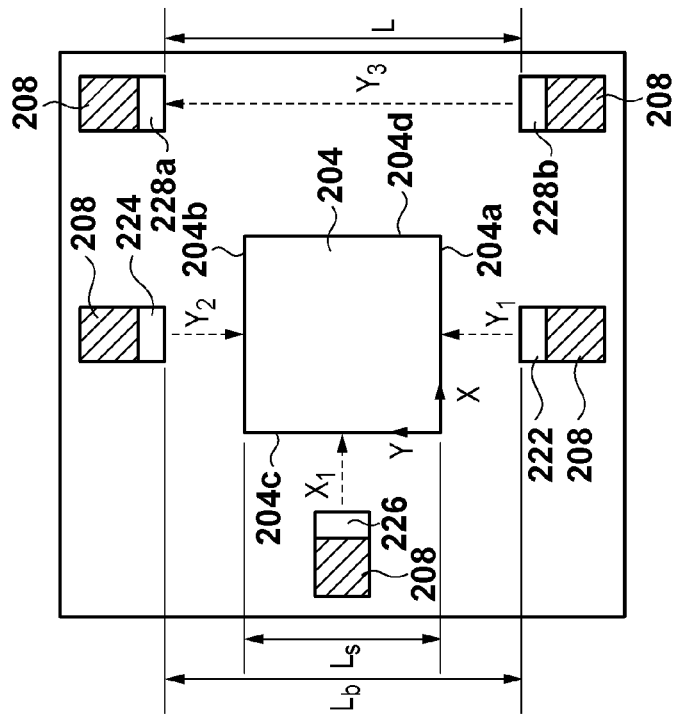

FIGS. 3A and 3B are schematic plan views showing the stage apparatus 20, shown in FIG. 2, as viewed from the negative Z-axis direction. FIG. 3A shows the state (reference state) in which no deformation is generated in the base portion 202 and table 204, and FIG. 3B shows the state in which deformation is generated in the base portion 202 and table 204.

First, the deformation amount of the table 204 is obtained. Let $L_s$ be the distance between the first end surface 204a and second end surface 204b of the table 204 in the Y-axis direction. Also, let $L_b$ be the distance between the first Y-axis interferometer 222 and the second Y-axis interferometer 224 in the Y-axis direction, and L be the distance between the Y-axis reflecting mirror 228a and the detection unit 228b in the Y-axis direction. Moreover, let $\Delta L_s$, $\Delta L_b$, and $\Delta L$ be the changes in distances $L_s$, $L_b$, and L, respectively, when deformation is generated in the base portion 202, that is, the deformation amounts of the base portion 202.

The measurement values obtained by the first Y-axis interferometer 222, second Y-axis interferometer 224, third Y-axis interferometer 228, and first X-axis interferometer 226 are reset to zero in the state shown in FIG. 3A. Also, the measurement value obtained by the first Y-axis interferometer 222 indicates the Y-axis coordinate of the first end surface 204a (reference). In this case, the measurement value $Y_1$ obtained by the first Y-axis interferometer 222, the measurement value $Y_2$ obtained by the second Y-axis interferometer 224, and the measurement value $Y_3$ obtained by the third Y-axis interferometer 228 have a specific correlation, and are respectively given by:

$$Y_1 = Y$$

$$Y_2 = -Y + \Delta L_b - \Delta L_s$$

$$Y_3 = \Delta L$$

The deformation amounts $\Delta L$ and $\Delta L_b$ are nearly equivalent to each other, as described above, so the deformation amount $\Delta L_s$ of the table 204 can be obtained by simple, four fundamental operations of arithmetic using the measurement values $Y_1$, $Y_2$, and $Y_3$ obtained by the respective Y-axis interferometers as:

$$\Delta L_s = -Y_1 - Y_2 + Y_3$$

Also, a deformation ratio $\epsilon$ representing the deformation amount of the table 204 per unit length can be obtained using the distance $L_s$ corresponding to the reference length of the table 204, and the deformation amount $\Delta L_s$ of the table 204 as:

$$\epsilon = \Delta L_s / L_s$$

Figure 4:
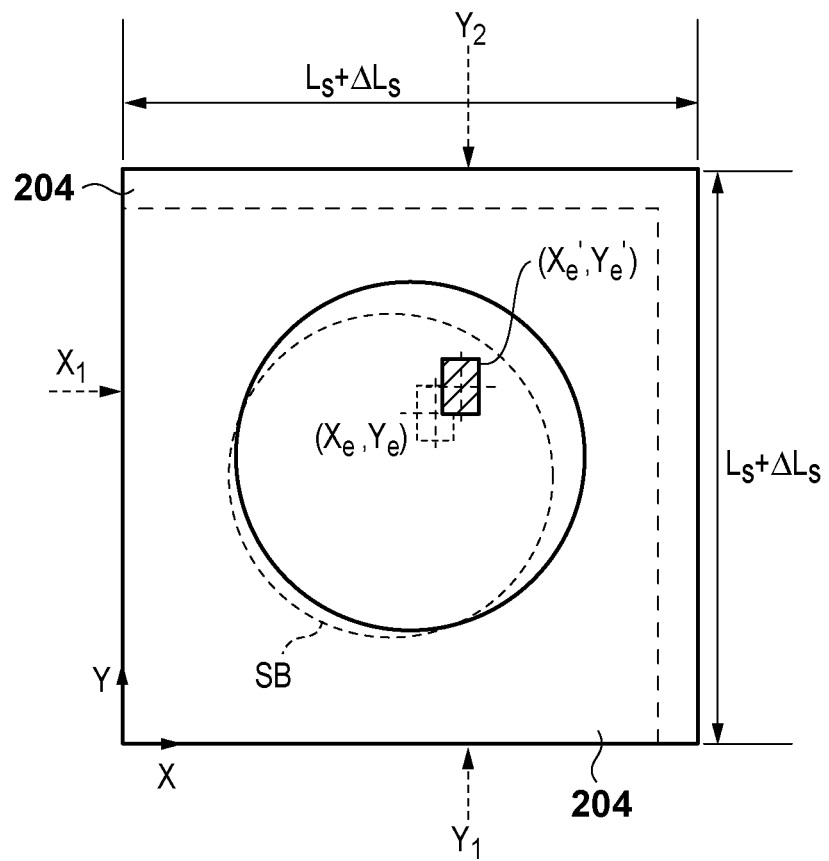
FIG. 4 is a schematic plan view showing a table of the stage apparatus shown in FIG. 2, and a substrate held on the table.

A corrected target position is then obtained by correcting the target position of the table 204 based on the deformation ratio $\epsilon$ of the table 204. FIG. 4 is a schematic plan view showing the table 204, and a substrate SB held on the table 204. Referring to FIG. 4, dotted lines indicate the state (reference state) in which no deformation is generated in the table 204 and substrate SB, and solid lines indicate the state in which deformation is generated in the table 204 and substrate SB. In this case, the lower left corner of the table 204 is defined as the origin of the X- and Y-axis coordinates representing the positions of the table 204 and substrate SB.

As shown in FIG. 4, the target exposure position of an arbitrary shot region on the substrate SB, which is obtained in the alignment process (global alignment), that is, a target position $(X_e, Y_e)$ of the table 204 fluctuates to $(X_e', Y_e')$ upon deformation of the table 204. Therefore, to position the table 204, the corrected target position $(X_e', Y_e')$ must be obtained by correcting the target position $(X_e, Y_e)$ of the table 204. Assuming herein that the table 204 and substrate SB suffer the same amount of deformation, the corrected target position $(X_e', Y_e')$ can be obtained using the deformation ratio $\epsilon$ of the table 204 as:

$$(X_e', Y_e') = (X_e + \epsilon X_e, Y_e + \epsilon Y_e)$$

The table 204 is then positioned so that the position of the table 204, which is obtained from the measurement value $Y_1$ obtained by the first Y-axis interferometer 222, and the measurement value $Y_2$ obtained by the second Y-axis interferometer 224, is set at the corrected target position $(X_e', Y_e')$. This makes it possible to reduce transfer errors such as a shift in position and a shift in magnification, thus forming a pattern in a predetermined shot region (that is, at the corrected target position $(X_e', Y_e')$) on the substrate SB with high accuracy.

Also, shot regions (their areas) indicated by hatched portions in FIGS. 3A and 3B also fluctuate depending on the deformation ratio $\epsilon$ of the table 204, and this often makes it impossible to transfer a pattern having a predetermined magnification (size) onto a substrate ST. In such a case, a magnification error of a pattern to be transferred onto the substrate ST can be corrected using a magnification correction mechanism of the electron optical system 10 so as to obtain a pattern having a predetermined magnification, based on the deformation ratio ϵ of the table 204. Since this correction can be done during the exposure process, the pattern transfer accuracy can be improved without stopping or delaying the exposure process, that is, without lowering the throughput (productivity) of the exposure apparatus.

Note that if the table 204 and substrate ST suffer different amounts of deformation, a pattern actually transferred onto the substrate ST may be detected to correct the deformation ratio ϵ of the table 204 so that the deformation ratio ϵ of the table 204 and the deformation amount of the substrate ST have a specific correspondence. Once the deformation ratio ϵ of the table 204 is corrected, deformation of the table 204 and substrate ST can be corrected simply by adding simple, four fundamental operations of arithmetic. Hence, this correction has little influence on the processing time in the exposure process.

Figure 5:
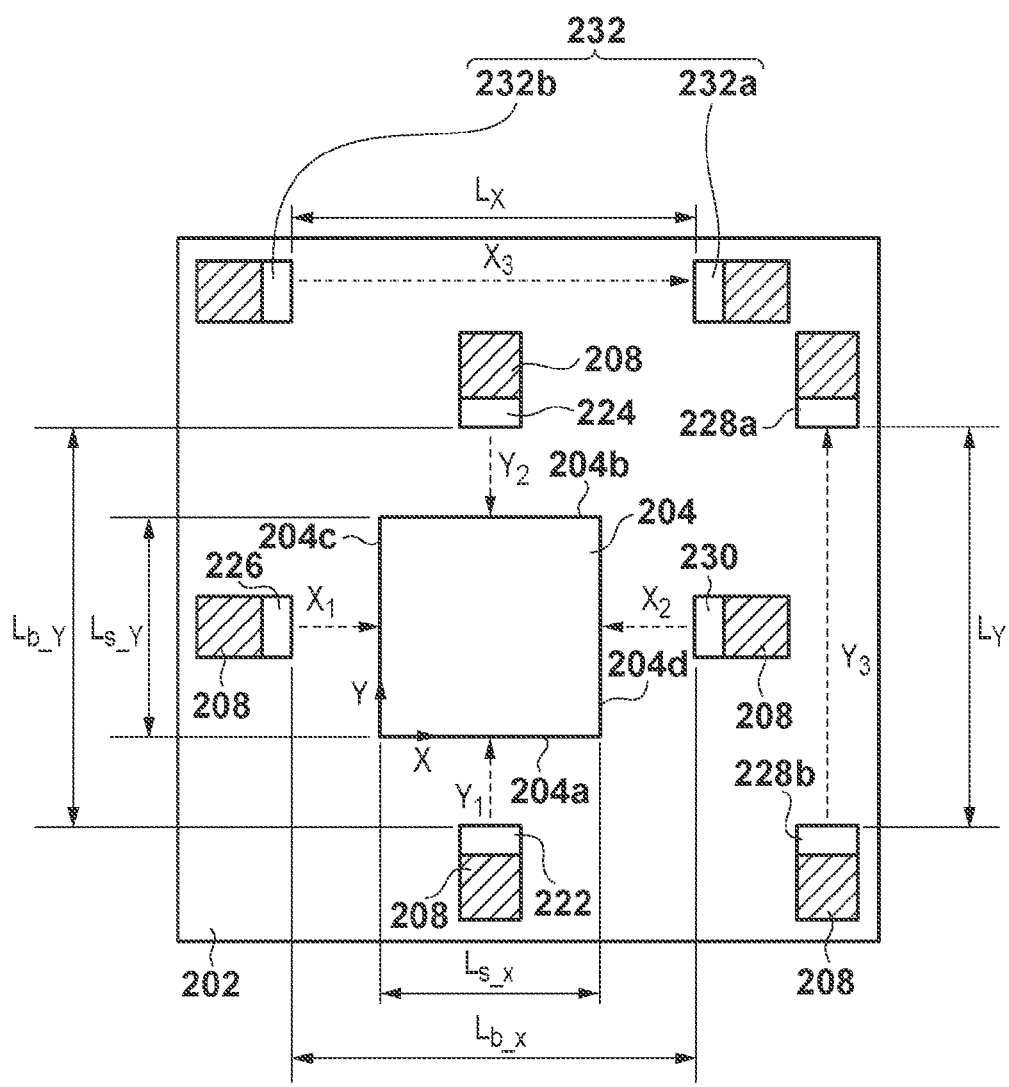
FIG. 5 is a schematic plan view showing the arrangement of a stage apparatus, which is applicable to the exposure apparatus shown in FIG. 1, as viewed from the negative Z-axis direction.

The above description has assumed that the table 204 isotropically deforms in the X- and Y-axis directions. However, if the table 204 anisotropically deforms in the X- and Y-axis directions, the stage apparatus 20 can be configured as shown in FIG. 5. FIG. 5 is a schematic plan view showing the arrangement of a stage apparatus 20, which is applicable to the exposure apparatus 1, as viewed from the negative Z-axis direction. The stage apparatus 20 shown in FIG. 5 includes a second X-axis interferometer 230 and third X-axis interferometer 232, in addition to the first Y-axis interferometer 222, second Y-axis interferometer 224, first X-axis interferometer 226, and third Y-axis interferometer 228.

The second X-axis interferometer 230 includes a light source which emits measurement light in the negative X-axis direction, and a detection unit which detects the measurement light, and is supported by the base portion 202 so as to have a measurement optical path in the X-axis direction. The second X-axis interferometer 230 detects measurement light which passes through the measurement optical path, is reflected by a fourth end surface 204d of the table 204, and travels back along the measurement optical path, thereby measuring the position of the fourth end surface 204d in the X-axis direction.

The third X-axis interferometer 232 includes a light source which emits measurement light in the positive X-axis direction, an X-axis reflecting mirror 232a which reflects the measurement light, and a detection unit 232b which detects the measurement light reflected by the X-axis reflecting mirror 232a. The third X-axis interferometer 232 is supported by the base portion 202 so as to have a measurement optical path in the X-axis direction. The third X-axis interferometer 232 detects the measurement light returned from a round trip along the measurement optical path, thereby measuring a distance according to which the distance between the first X-axis interferometer 226 and the second X-axis interferometer 230 in the X-axis direction can be obtained.

In this embodiment, the X-axis reflecting mirror 232a is supported by the base portion 202 so that its X- and Z-axis coordinates are the same as those of the second X-axis interferometer 230, and only its Y-axis coordinate is different from that of the second X-axis interferometer 230. Also, the detection unit 232b is supported by the base portion 202 so that its X- and Z-axis coordinates are the same as those of the first X-axis interferometer 226, and only its Y-axis coordinate is different from that of the first X-axis interferometer 226. Therefore, the third X-axis interferometer 232 measures the distance between the X-axis reflecting mirror 232a and the detection unit 232b, that is, a distance corresponding to the distance between the first X-axis interferometer 226 and the second X-axis interferometer 230 in the X-axis direction in this embodiment. The X-axis reflecting mirror 232a and detection unit 232b are arranged such that the measurement optical path does not interfere with the range in which the table 204 can move.

Positioning of the table 204 by the control unit 30 will be described below with reference to FIG. 5. In this case, let $X_2$ and $X_3$ be the measurement value obtained by the second X-axis interferometer 230, and that obtained by the third X-axis interferometer 232, respectively. Also, let $\Delta L_{s\_X}$ be the deformation amount of the table 204 in the X-axis direction, and $\Delta L_{s\_Y}$ be the deformation amount of the table 204 in the Y-axis direction.

A fluctuation in distance between the first X-axis interferometer 226 and the second X-axis interferometer 230 due to deformation of the base portion 202, and that in distance between the X-axis reflecting mirror 232a and the detection unit 232b due to the deformation of the base portion 202, are nearly equivalent to each other. Therefore, the deformation amount $\Delta L_{s\_X}$ of the table 204 in the X-axis direction, and the deformation amount $\Delta L_{s\_Y}$ of the table 204 in the Y-axis direction, can be obtained using the measurement values $Y_1$, $Y_2$, $Y_3$, $X_1$, $X_2$, and $X_3$ obtained by the respective interferometers as:

$$\Delta L_{s\_X} = -X_1 - X_2 + X_3$$

$$\Delta L_{s\_Y} = -Y_1 - Y_2 + Y_3$$

Also, a deformation ratio $\epsilon_X$ representing the deformation amount of the table 204 in the X-axis direction per unit length, and a deformation ratio $\epsilon_Y$ of the table 204 in the Y-axis direction per unit length, can be obtained by:

$$\epsilon_X = \Delta L_{s\_X} / L_{s\_X}$$

$$\epsilon_Y = \Delta L_{s\_Y} / L_{s\_Y}$$

where $L_{s\_X}$ is the distance corresponding to the reference length of the table 204 in the X-axis direction, $L_{s\_Y}$ is the distance corresponding to the reference length of the table 204 in the Y-axis direction, and $\Delta L_{s\_X}$ and $\Delta L_{s\_Y}$ are the changes in $L_{s\_X}$ and $L_{s\_Y}$, respectively, that is, the deformation amounts of the table 204 in the X- and Y-axis directions, respectively.

A corrected target position is then obtained by correcting the target position of the table 204 based on the deformation ratios $\epsilon_X$ and $\epsilon_Y$ of the table 204. The target exposure position of an arbitrary shot region on the substrate, that is, a target position $(X_e, Y_e)$ of the table 204 fluctuates to $(X_e', Y_e')$ upon deformation of the table 204, as described above. Therefore, to position the table 204, the corrected target position $(X_e', Y_e')$ must be obtained by correcting the target position $(X_e, Y_e)$ of the table 204. The corrected target position $(X_e', Y_e')$ can be obtained using the deformation ratios $\epsilon_X$ and $\epsilon_Y$ of the table 204 as:

$$(X_e', Y_e') = (X_e + \epsilon_X X_e, Y_e + \epsilon_Y Y_e)$$

The table 204 is then positioned so that the position of the table 204, which is obtained from the measurement values $Y_1$, $Y_2$, $X_1$, and $X_2$ obtained by the respective interferometers, is set at the corrected target position $(X_e', Y_e')$. This makes it possible to reduce transfer errors such as a shift in position and a shift in magnification, thus forming a pattern in a predetermined shot region (that is, at the corrected target position $(X_e', Y_e')$) on the substrate SB with high accuracy. Also, a magnification error of a pattern to be transferred onto the substrate ST can be corrected using the magnification correction mechanism of the electron optical system 10 so as to obtain a pattern having a predetermined magnification, based on the deformation ratios $\epsilon_X$ and $\epsilon_Y$ of the table 204.

A situation in which the base portion 202 anisotropically deforms (undergoes anisotropic expansion/contraction deformation) in the X- and Y-axis directions may be encountered as well. Expansion/contraction deformation of the base portion 202 is generated mainly due to thermal deformation, but when a plurality of heat sources or a plurality of temperature regulating portions are provided near the base portion 202, a temperature distribution may be generated in the base portion 202 so that the base portion 202 anisotropically deforms in the X- and Y-axis directions.

Figure 6:
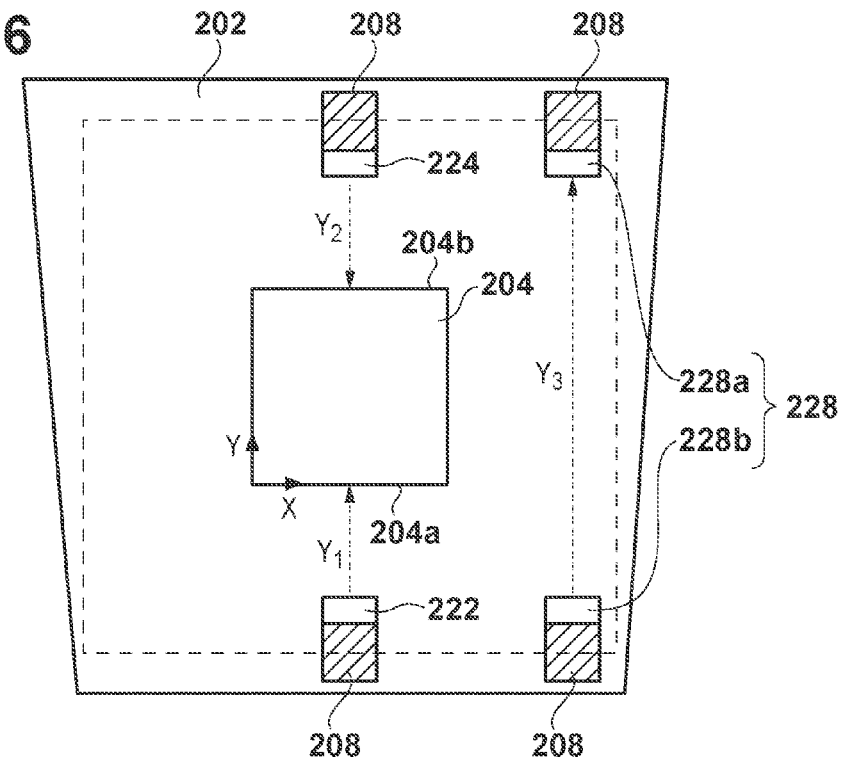
FIG. 6 is a schematic plan view showing the stage apparatus when a base portion anisotropically deforms in the Y-axis direction, as viewed from the negative Z-axis direction.

When, for example, the base portion 202 anisotropically deforms in the Y- and Z-axis directions, the configuration of the stage apparatus 20 shown in FIGS. 3A and 3B can be used to cope with this situation, as shown in FIG. 6. FIG. 6 is a schematic plan view showing the stage apparatus 20 when the base portion 202 anisotropically deforms in the Y-axis direction, as viewed from the negative Z-axis direction. Referring to FIG. 6, although the deformation ratio of the base portion 202 varies depending on the position of the base portion 202 in the Y-axis direction, the measurement value obtained by the third Y-axis interferometer 228 is nearly equivalent to a fluctuation in distance between the first Y-axis interferometer 222 and the second Y-axis interferometer 224. This is because the Y-axis reflecting mirror 228a has the same Y-axis coordinate as that of the second Y-axis interferometer 224, and the detection unit 228b has the same Y-axis coordinate as that of the first Y-axis interferometer 222. Note that when anisotropic deformation in the Z-axis direction is generated in the base portion 202, three-dimensional bending deformation is generated in the base portion 202. Therefore, the measurement value obtained by the third Y-axis interferometer 228 is nearly equivalent to a fluctuation in distance between the first Y-axis interferometer 222 and the second Y-axis interferometer 224, as in the above-mentioned bending deformation.

Figure 7:
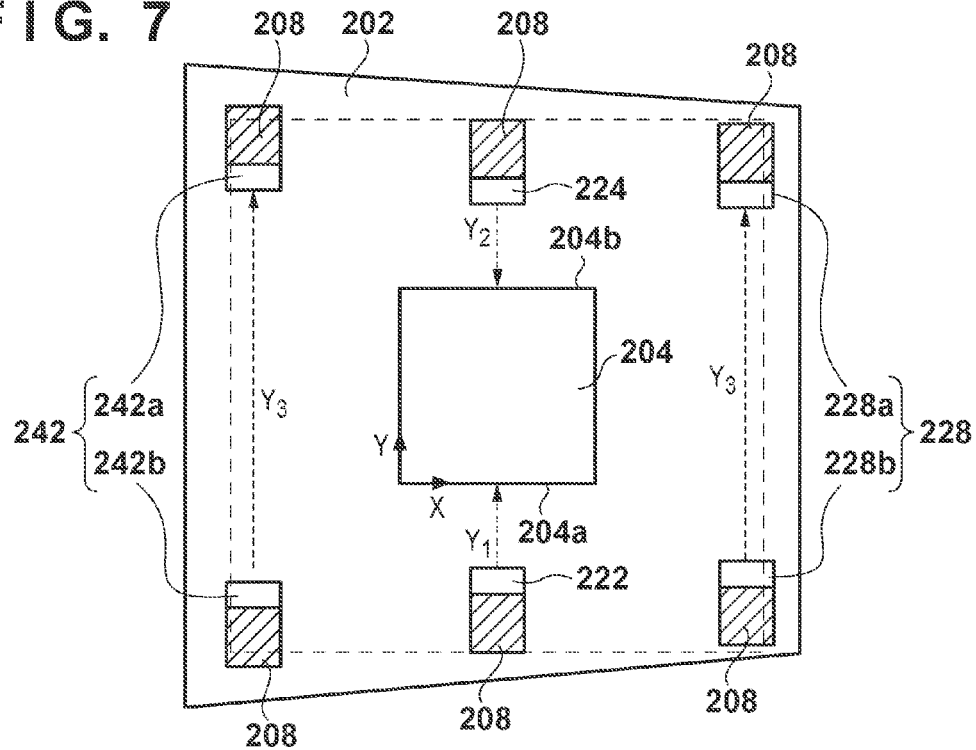
FIG. 7 is a schematic plan view showing the stage apparatus when the base portion anisotropically deforms in the X-axis direction, as viewed from the negative Z-axis direction.
Figure 8A:
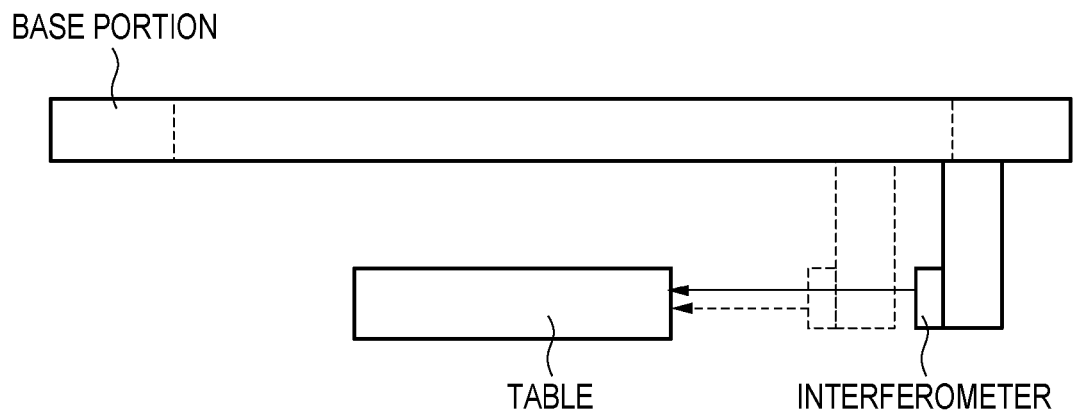
FIGS. 8A and 8B are views showing a fluctuation in position of an interferometer when expansion/contraction deformation is generated in a base portion, and that when bending deformation is generated in the base portion, respectively.
Figure 8B:
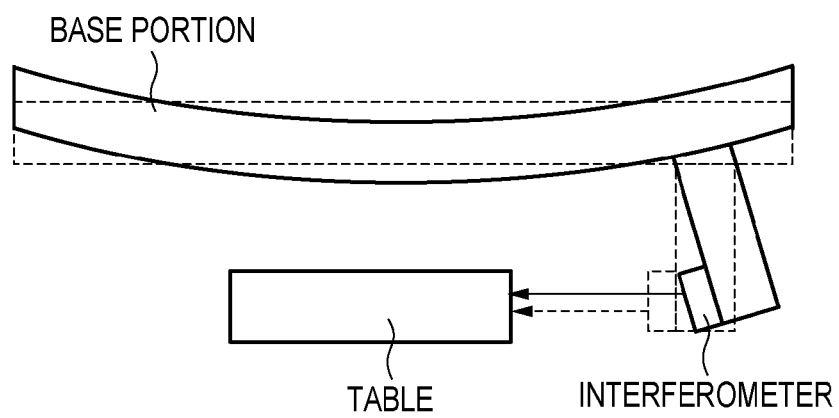

On the other hand, when the base portion 202 anisotropically deforms in the X-axis direction, the deformation ratio of the base portion 202 varies depending on the position of the base portion 202 in the X-axis direction, as shown in FIG. 7. In this case, the measurement value obtained by the third Y-axis interferometer 228 may be different from a fluctuation in distance between the first Y-axis interferometer 222 and the second Y-axis interferometer 224. To combat this situation, a fourth Y-axis interferometer 242 can be placed at a position, which is different in X-axis coordinate from that of the third Y-axis interferometer 228, so as to have a measurement optical path (fourth measurement optical path) in the Y-axis direction, as shown in FIG. 7. The fourth Y-axis interferometer 242 includes a light source which emits measurement light in the positive Y-axis direction, a Y-axis reflecting mirror 242a which reflects the measurement light, and a detection unit 242b which detects the measurement light reflected by the Y-axis reflecting mirror 242a. The Y-axis reflecting mirror 242a is supported by the base portion 202 so that its Y- and Z-axis coordinates are the same as those of the second Y-axis interferometer 224, and only its X-axis coordinate is different from that of the second Y-axis interferometer 224. Also, the detection unit 242b is supported by the base portion 202 so that its Y- and Z-axis coordinates are the same as those of the first Y-axis interferometer 222, and only its X-axis coordinate is different from that of the first Y-axis interferometer 222. This makes it possible to obtain the deformation amount of the table 204 based on the measurement value obtained by the first Y-axis interferometer 222, the measurement value obtained by the second Y-axis interferometer 224, and the value obtained by interpolation processing between the measurement value obtained by the third Y-axis interferometer 228, and that obtained by the fourth Y-axis interferometer 242. In other words, even if the base portion 202 deforms anisotropically, a fluctuation in distance between the first Y-axis interferometer 222 and the second Y-axis interferometer 224 can be obtained by interpolation processing between the measurement value obtained by the third Y-axis interferometer 228, and that obtained by the fourth Y-axis interferometer 242.

In this manner, since the exposure apparatus 1 can align the table 204 of the stage apparatus 20 with high accuracy, it can form a pattern on the substrate with high accuracy. Hence, the exposure apparatus 1 can provide high-quality devices (for example, a semiconductor integrated circuit device and a liquid crystal display device) with a high throughput and good economic efficiency. These devices are fabricated through a step of exposing a substrate (e.g., a wafer or glass plate) coated with a photoresist (sensitizer) by using the exposure apparatus 1, a step of developing the exposed substrate, and other known steps.

The present invention is not limited to an electron beam exposure apparatus, and is also applicable to a projection exposure apparatus including a projection optical system which projects the pattern of a reticle onto a substrate. The present invention is not limited to a stage apparatus which holds and drives a substrate, either, and is also applicable to a stage apparatus which holds and drives, for example, a reticle.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-278394, filed on Dec. 14, 2010, which is hereby incorporated by reference herein in its entirety.

What is claimed is:

1. A stage apparatus comprising:
   a base portion;
   a table capable of moving along an X-Y plane defined in an X-Y-Z coordinate system;
   a first Y-axis interferometer which is supported by the base portion so as to have a first measurement optical path in a Y-axis direction of the X-Y-Z coordinate system, and configured to detect measurement light which passes through the first measurement optical path, is reflected by a first end surface of the table, and travels back along the first measurement optical path, thereby measuring a position of the first end surface in the Y-axis direction;
   a second Y-axis interferometer which is supported by the base portion so as to have a second measurement optical path in the Y-axis direction, and configured to detect measurement light which passes through the second measurement optical path, is reflected by a second end surface of the table, that is opposite to the first end surface in the Y-axis direction, and travels back along the second measurement optical path, thereby measuring a position of the second end surface in the Y-axis direction;
   a third Y-axis interferometer which is supported by the base portion so as to have a third measurement optical path in the Y-axis direction and be spaced apart from the first Y-axis interferometer and the second Y-axis interferometer in an X-axis direction of the X-Y-Z coordinate system, and configured to detect measurement light returned from a round trip along the third measurement optical path, thereby measuring a distance between the first Y-axis interferometer and the second Y-axis interferometer in the Y-axis direction; and a control unit configured to obtain a deformation amount of the table based on the measurement value obtained by the first Y-axis interferometer, the measurement value obtained by the second Y-axis interferometer, and the measurement value obtained by the third Y-axis interferometer, and obtain a corrected target position by correcting a target position of the table based on the deformation amount of the table, thereby positioning the table so that a position of the table, which is obtained from the measurement value obtained by the first Y-axis interferometer, and the measurement value obtained by the second Y-axis interferometer, is set at the corrected target position, wherein the third Y-axis interferometer includes:

a Y-axis reflecting mirror which is supported by the base portion so that a Y-axis coordinate and Z-axis coordinate thereof in the X-Y-Z coordinate system are identical to a Y-axis coordinate and Z-axis coordinate of the second Y-axis interferometer in the X-Y-Z coordinate system, and is configured to reflect the measurement light which passes through the third measurement optical path, and a detection unit which is supported by the base portion so that a Y-axis coordinate and Z-axis coordinate thereof in the X-Y-Z coordinate system are identical to a Y-axis coordinate and Z-axis coordinate of the first Y-axis interferometer in the X-Y-Z coordinate system, and is configured to detect the measurement light which is reflected by the Y-axis reflecting mirror, and travels back along the third measurement optical path.

2. The apparatus according to claim 1, wherein the control unit obtains a deformation ratio representing a deformation amount of the table per unit length from the deformation amount of the table, to obtain the corrected target position based on the deformation ratio.

3. The apparatus according to claim 1, wherein letting $Y_1$ be the measurement value obtained by the first Y-axis interferometer, $Y_2$ be the measurement value obtained by the second Y-axis interferometer, and $Y_3$ be the measurement value obtained by the third Y-axis interferometer, the control unit obtains a deformation amount $\Delta L_s$ of the table across a distance $L_s$ between the first end surface and the second end surface of the table by $-Y_1-Y_2+Y_3$, and obtains a deformation ratio $\epsilon$ representing a deformation amount of the table per unit length by $\Delta L_s/L_s$, thereby obtaining the corrected target position $(X_e',Y_e')$ by correcting the target position $(X_e,Y_e)$ of the table by $(X_e+\epsilon X_e, Y_e+\epsilon Y_e)$.

4. The apparatus according to claim 1, further comprising a fourth Y-axis interferometer which is supported by the base portion so as to have a fourth measurement optical path in the Y-axis direction and be spaced apart from the first Y-axis interferometer and the second Y-axis interferometer in an X-axis direction of the X-Y-Z coordinate system, and configured to detect measurement light returned from a round trip along the fourth measurement optical path, thereby measuring a distance according to which a distance between the first Y-axis interferometer and the second Y-axis interferometer in the Y-axis direction can be obtained, wherein the control unit obtains the deformation amount of the table based on the measurement value obtained by the first Y-axis interferometer, the measurement value obtained by the second Y-axis interferometer, and the distance between the first Y-axis interferometer and the second Y-axis interferometer in the Y-axis direction, which is obtained by interpolation processing using the measurement value obtained by the third Y-axis interferometer, and the measurement value obtained by the fourth Y-axis interferometer.

5. An exposure apparatus comprising:

a stage apparatus defined in claim 1; and an optical system configured to expose a substrate held on the stage apparatus.

6. A device fabrication method comprising steps of:

exposing a substrate using an exposure apparatus; and performing a development process for the substrate exposed, wherein the exposure apparatus includes:

a stage apparatus; and an optical system configured to expose a substrate held on the stage apparatus, wherein the stage apparatus includes:

a base portion;

a table capable of moving along an X-Y plane defined in an X-Y-Z coordinate system;

a first Y-axis interferometer which is supported by the base portion so as to have a first measurement optical path in a Y-axis direction of the X-Y-Z coordinate system, and configured to detect measurement light which passes through the first measurement optical path, is reflected by a first end surface of the table, and travels back along the first measurement optical path, thereby measuring a position of the first end surface in the Y-axis direction;

a second Y-axis interferometer which is supported by the base portion so as to have a second measurement optical path in the Y-axis direction, and configured to detect measurement light which passes through the second measurement optical path, is reflected by a second end surface of the table, that is opposite to the first end surface in the Y-axis direction, and travels back along the second measurement optical path, thereby measuring a position of the second end surface in the Y-axis direction;

a third Y-axis interferometer which is supported by the base portion so as to have a third measurement optical path in the Y-axis direction and be spaced apart from the first Y-axis interferometer and the second Y-axis interferometer in an X-axis direction of the X-Y-Z coordinate system, and configured to detect measurement light returned from a round trip along the third measurement optical path, thereby measuring a distance between the first Y-axis interferometer and the second Y-axis interferometer in the Y-axis direction; and a control unit configured to obtain a deformation amount of the table based on the measurement value obtained by the first Y-axis interferometer, the measurement value obtained by the second Y-axis interferometer, and the measurement value obtained by the third Y-axis interferometer, and obtain a corrected target position by correcting a target position of the table based on the deformation amount of the table, thereby positioning the table so that a position of the table, which is obtained from the measurement value obtained by the first Y-axis interferometer, and the measurement value obtained by the second Y-axis interferometer, is set at the corrected target position, wherein the third Y-axis interferometer includes:

a Y-axis reflecting mirror which is supported by the base portion so that a Y-axis coordinate and Z-axis coordinate thereof in the X-Y-Z coordinate system are identical to a Y-axis coordinate and Z-axis coordinate of the second Y-axis interferometer in the X-Y-Z coordinate system, and is configured to reflect the measurement light which passes through the third measurement optical path, and a detection unit which is supported by the base portion so that a Y-axis coordinate and Z-axis coordinate thereof in the X-Y-Z coordinate system are identical to a Y-axis coordinate and Z-axis coordinate of the first Y-axis interferometer in the X-Y-Z coordinate system, and is configured to detect the measurement light which is reflected by the Y-axis reflecting mirror, and travels back along the third measurement optical path.

* * * * *